(12) United States Patent
Gritz et al.

(10) Patent No.: US 8,981,794 B2
(45) Date of Patent: Mar. 17, 2015

(54) LOSS-LESS FREQUENCY DEPENDENT DICKE-SWITCHED RADIOMETER

(71) Applicant: Raytheon Company, Waltham, MA (US)

(72) Inventors: Michael Aidan Gritz, Santa Barbara, CA (US); Steven Marc Lardizabal, Westford, MA (US); Zhaoyang Charles Wang, Carlisle, MA (US)

(73) Assignee: Raytheon Company, Waltham, MA (US)

( * ) Notice: Subject to any disclaimer, the term of this patent is extended or adjusted under 35 U.S.C. 154(b) by 88 days.

(21) Appl. No.: 13/927,001

(22) Filed: Jun. 25, 2013

(65) Prior Publication Data

US 2014/0375336 A1 Dec. 25, 2014

(51) Int. Cl.
*G01R 27/04* (2006.01)
*G01S 3/02* (2006.01)
*G01R 27/32* (2006.01)

(52) U.S. Cl.
CPC ..................................... *G01R 27/32* (2013.01)
USPC .......................... 324/647; 324/76.14; 324/606

(58) Field of Classification Search
None
See application file for complete search history.

(56) References Cited

U.S. PATENT DOCUMENTS

| | | | |
|---|---|---|---|
| 3,628,151 A * | 12/1971 | Roeder | 324/76.14 |
| 3,638,494 A | 2/1972 | Broussaud et al. | |
| 6,217,210 B1 | 4/2001 | Roeder et al. | |
| 7,221,141 B2 * | 5/2007 | Bills | 324/95 |
| 7,250,747 B1 * | 7/2007 | Ammar | 324/76.14 |

OTHER PUBLICATIONS

Tofighi, et al., "A Microwave System for blood Perfusion Measurements of Tissue; a Preliminary Study", 2013 IEEE Topical Conference on Biomedical Wireless Technologies, Networks, and Sensing Systems, IEEE, Jan. 20, 2013 (pp. 49-51).
Dicke, "The Measurement of Thermal Radiation at Microwave Frequencies", The Review of Sicientific Instruments, vol. 17, No. 7, Jul. 1, 1946 (pp. 268-275).
Written Opinion of the International Searching Authority for International Application No. PCT/US2014/035573 filed Apr. 25, 2014, Written Opinion of the International Searching Authority mailed Sep. 30, 2014 (5 pgs.).
International Search Report for International Application No. PCT/US2014/035573 filed Apr. 25, 2014, International Search Report dated Sep. 22, 2014 and mailed Sep. 30, 2014 (4 pgs.).

* cited by examiner

*Primary Examiner* — Minh N Tang
(74) *Attorney, Agent, or Firm* — Christie, Parker & Hale, LLP

(57) ABSTRACT

A Dicke-switched radiometer including a signal channel comprising of an antenna for receiving an input signal and a first stage amplification circuit for amplifying an output of the antenna and generating an amplified input signal; a reference channel comprising of a resistive load, a second stage amplification circuit and a matching filter for matching a frequency and an impedance of the amplified input signal to a frequency and an impedance of the amplified reference signal; a Dicke switch coupled to first stage amplification circuit and the matching filter for inputting the amplified input signal and an output of the matching filter to generate a difference signal; a third stage amplification circuit coupled to an output of the Dicke switch for amplifying the difference signal; and a detector coupled to an output of the third stage amplification circuit to obtain the amplified difference signal and generate a detected difference signal.

11 Claims, 5 Drawing Sheets

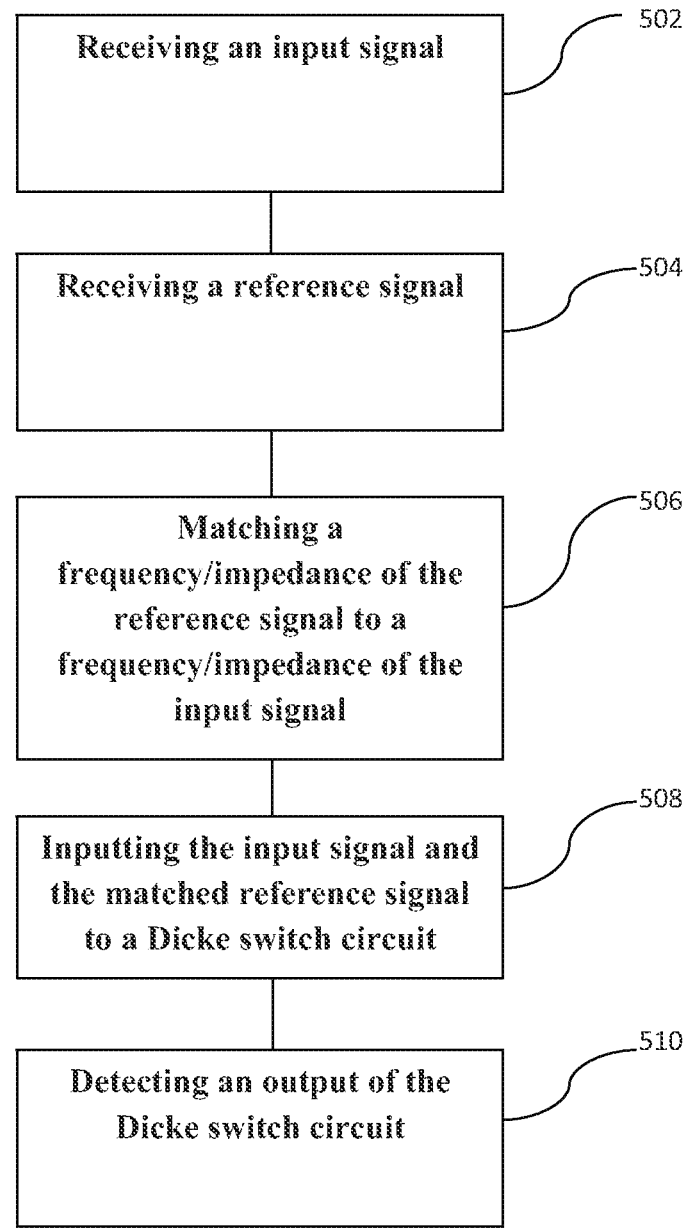

US 8,981,794 B2

LOSS-LESS FREQUENCY DEPENDENT DICKE-SWITCHED RADIOMETER

STATEMENT REGARDING FEDERALLY SPONSORED RESEARCH

This invention disclosure is related to a government contract. The U.S. Government has certain rights to this invention.

FIELD OF THE INVENTION

The present invention relates to electronic circuits and more specifically a loss-less frequency dependent Dicke-switched radiometer.

BACKGROUND

Imaging radiometers are used for many applications, such as aviation, including airport and aircraft safety and all-weather vision, medical and plasma diagnostics, non-destructive testing for voids and delaminations in composite materials, remote sensing of agricultural and environmental conditions, and a wide variety of defense, security, and law enforcement purposes.

An imaging radiometer measures the power of electromagnetic radiation or brightness temperatures emitted from a segment of a remote object, for example, a radio receiver that measures the average power of electromagnetic radiation including noise emitted from an object in a defined frequency range. Radiated power from a segment of a remote object contains information regarding the size, shape, and material composition of the object. Radiated object power is proportional to temperature and is commonly referred to as scene temperature. A radiometer captures scene temperatures through a signal chain designed to detect the typically weak radiated object power. The signal chain comprises three functions including: an aperture which collects electromagnetic energy, signal amplifiers which increase the received object power level, and a detector which transforms object power to either a voltage or current which are convenient for signal processing.

An imaging radiometer provides for a variety of different applications that deal with variation of the input power to detect objects or processes, for example, in target detection and medical imaging. Since the power of the input signal is typically substantially small, radiometers often employ signal comparison techniques, such as Dicke-switching to allow measurement of signal levels collected below the noise level of the signal chain. Accordingly, such radiometers also minimize (or neutralize) their gain variations by measuring the difference in signals between the signal chain input and a reference signal input.

A Dicke-switched radiometer is a radiometer that includes a Dicke switch that switches the input of the radiometer between a signal channel/chain and a reference channel/chain, for example, noise generated by a resistor.

FIG. 1 shows a conventional Dicke-switched radiometer. As shown, the Dicke-switched radiometer 100 employs a white noise resistive reference load 102 and a first (two-) stage tow noise amplification 104 as its reference channel. As the signal channel, the Dicke-switched radiometer 100 may include an antenna 108 for receiving an input signal and a second (two-) stage low noise amplification 106. The reference channel uses the calibrating resistive noise source 102 to modulate the signal captured by the antenna above the time-dependent noise (1/f noise) of the detector, low-noise amplifiers, and analog electronics. This modulation also assists in the removal of electronic DC offsets from each low noise amplifier (LNA) stage.

Dicke switch 110 rapidly switches the input of the radiometer between the signal channel and the reference channel. Gain variations in the radiometer can have their effects neutralized by measuring the difference in signals between the antenna signal and the noise input of the resistor (reference channel). The output of the Dicke switch 110 is then amplified by an amplification stage 112, including, for example four or more LNA amplifiers.

In a typical case, the difference signal is obtained by using a synchronous (differential) detector circuit 116. A square waveform that is used to switch the radiometer input from antenna to resistor is also used to drive the synchronous detector. The switching rate is typically between 30 and 10000 Hz. An analog read out circuit 118, as apart of the radiometer or separate from the radiometer, reads the output of the differential circuit and generates a square signal, as shown.

By modulating between the antenna signal channel and the reference signal channel, the (Dicke switched) radiometer also removes temperature drifts and provides a fully calibrated signal to a display. However, this radiometer requires the use of a band pass filter 114 to match the energy received from the antenna element and the reference channel. Without this matching, the reference channel will swamp out the signal channel resulting in catastrophic errors during the subtraction process of the signal and reference channels in the back end. Accordingly, a band pass filter 116 is placed after the Dicke switch (and a third LNA stage 112), which adds losses to the system that cannot be recovered. Additionally, the band pass filter could limit the signal chain gain, thereby reducing the sensitivity of the radiometer chip.

The operation of a Dicke switched radiometer reties upon comparison of an incident (or object) signal path and a reference signal path such that the object signal is received with minimal added noise arising from the systems own noise (random signal fluctuations). Since Dicke switched radiometers use frequency independent noise sources having a constant (white) noise spectrum, noise signals can easily be introduced outside an intended signal bandwidth.

The bandpass filter 114 is used to filter out this white noise source outside of the Dicke switch modulation signal. However, this bandpass filter 114 negatively impacts system performance since in-band attenuation of a bandpass filter reduces desired signal strength by narrowing the bandwidth of the amplification stage/chain 112. The signal bandwidth directly corresponds to how much power is collected the detector 116. Any reduction in bandwidth lowers the amount of signal collected and negatively impact the performance of the radiometer.

Some conventional designs use a variable cold/warm noise source that allows for improved calibration accuracy by allowing the reference path noise temperature to automatically adjust for optimal performance. A cold/warm noise source also uses impedance matching circuits to couple noise power to a radiometer. However, this design does not attempt to match frequency response with the antenna path therefore requiring use of a bandpass filter after the Dicke-switch.

Accordingly, there is a need for an improved Dicke switch radiometer that has better frequency response characteristics.

SUMMARY OF THE INVENTION

In some embodiments, the present invention is directed to an impedance and frequency matched reference channel load at microwave and millimeter-wave frequencies that provides the reference channel signal level which is balanced with the antenna signal level.

In some embodiments, the present invention is a Dicke-switched radiometer. The radiometer includes a signal channel comprising of an antenna for receiving an input signal and a first stage amplification circuit for amplifying an output of the antenna and generating an amplified input signal; a reference channel comprising of a resistive load, a second stage amplification circuit for amplifying an output of the resistive load and generating an amplified reference signal, and a matching filter coupled to an output of the second stage amplification circuit for matching a frequency and an impedance of the amplified input signal to a frequency and an impedance of the amplified reference signal; a Dicke switch coupled to first stage amplification circuit and the matching filter for inputting the amplified input signal and an output of the matching filter and switching between the amplified input signal and the output of the matching filter to generate a difference signal; a third stage amplification circuit coupled to an output of the Dicke switch for amplifying the difference signal; and a detector coupled to an output of the third stage amplification circuit to obtain the amplified difference signal and generate a detected difference signal.

In some embodiments, the present invention is a method for matching a Dicke-switched radiometer. The method includes: receiving an input signal from an antenna; receiving a reference signal from a load; matching a frequency and an impedance of the reference signal to a frequency and an impedance of the input signal; inputting the input signal and the matched reference signal to a Dicke switch circuit; and detecting an output of the Dicke switch circuit.

BRIEF DESCRIPTION OF THE DRAWINGS

A more complete appreciation of the present invention, and many of the attendant features and aspects thereof, will become more readily apparent as the invention becomes better understood by reference to the following detailed description when considered in conjunction with the accompanying drawings in which like reference symbols indicate like components, wherein:

FIG. 5 is an exemplary process flow, according to some embodiments of the present invention.

DETAILED DESCRIPTION

The present invention is directed to an impedance and frequency matched reference noise source design at microwave and millimeter-wave frequencies that provides for balance signal levels in the antenna and reference signal path in a Dicke switched radiometer. This implementation overcomes attenuation introduced by bandpass filtering that is conventionally used and to reduce reference channel input signals outside of the antenna signal level bandwidth. The balancing of both the antenna and reference path in this way provides several benefits, for example, i) bandpass filter is required in the signal chain to remove unwanted noise from the reference channel, ii) gain and noise figure of the signal chain improve by a factor proportional to the insertion loss of the band-pass filter, and iii) the physical size of the signal chain reduces by a factor proportional to the size of the bandpass filter.

Figure 1:
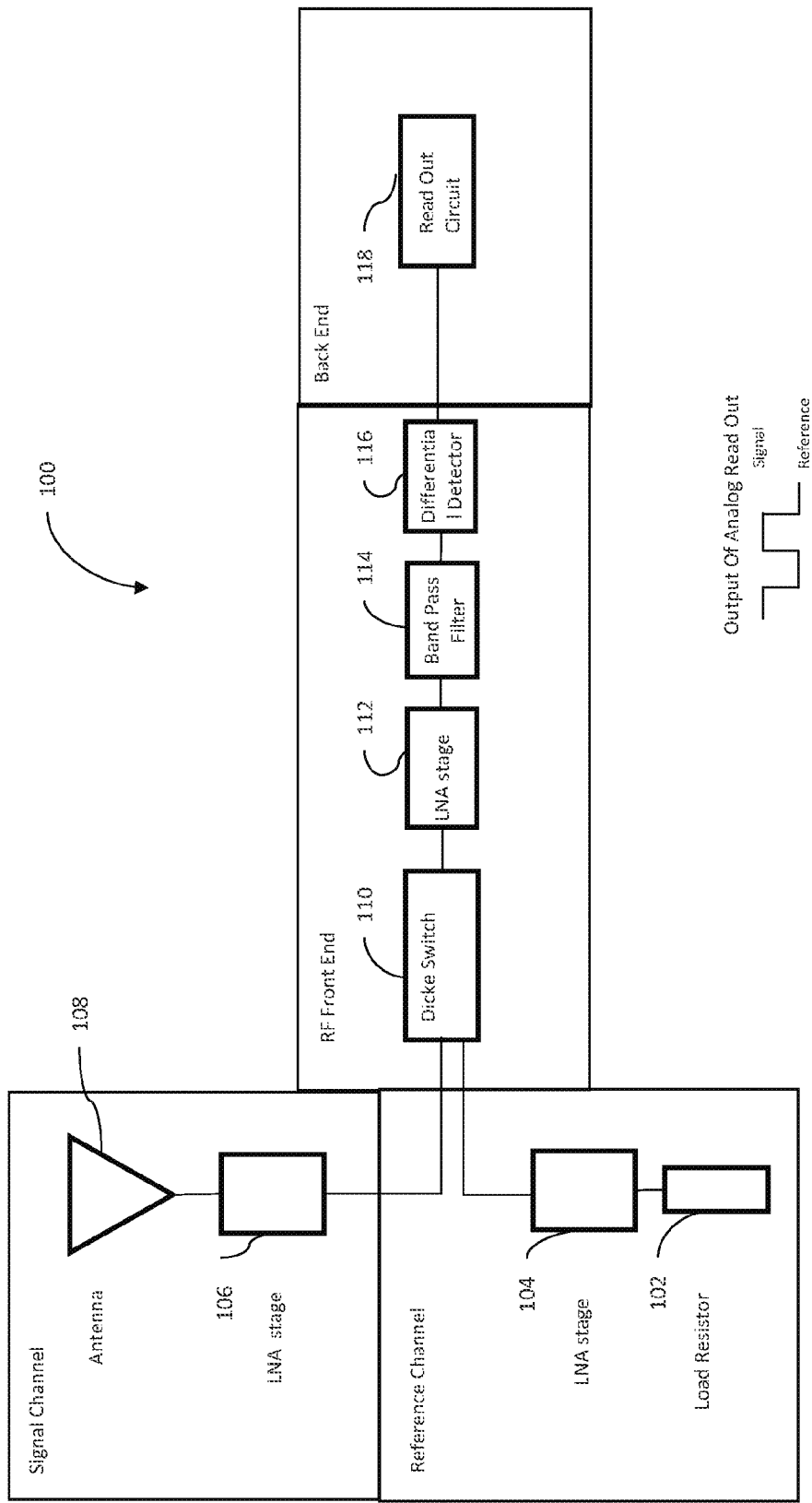
FIG. 1 depicts conventional Dicke-switched radiometer.
Figure 2:
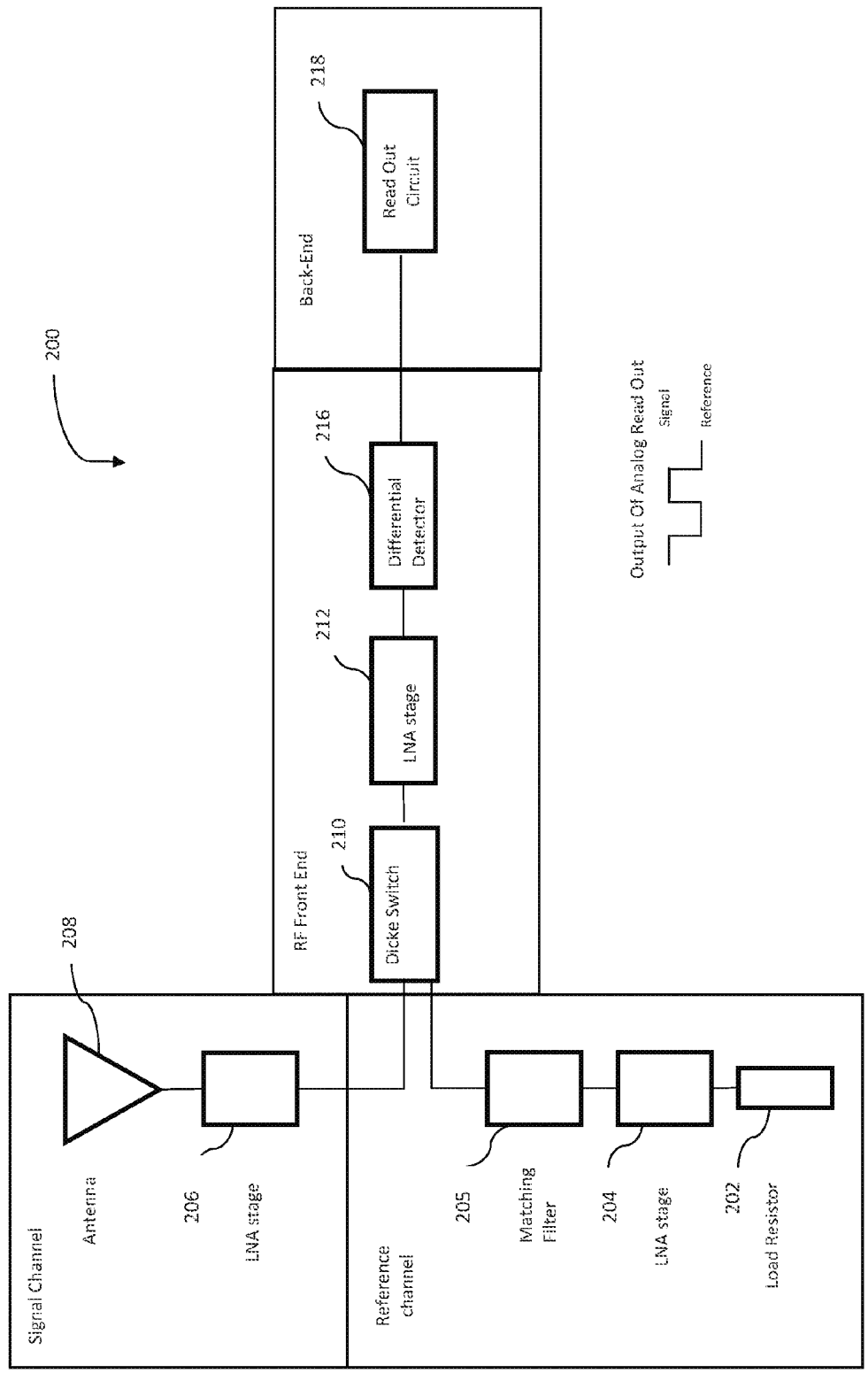
FIG. 2 shows an exemplary Dicke-switched radiometer, according to some embodiments of the present invention.
Figure 4:
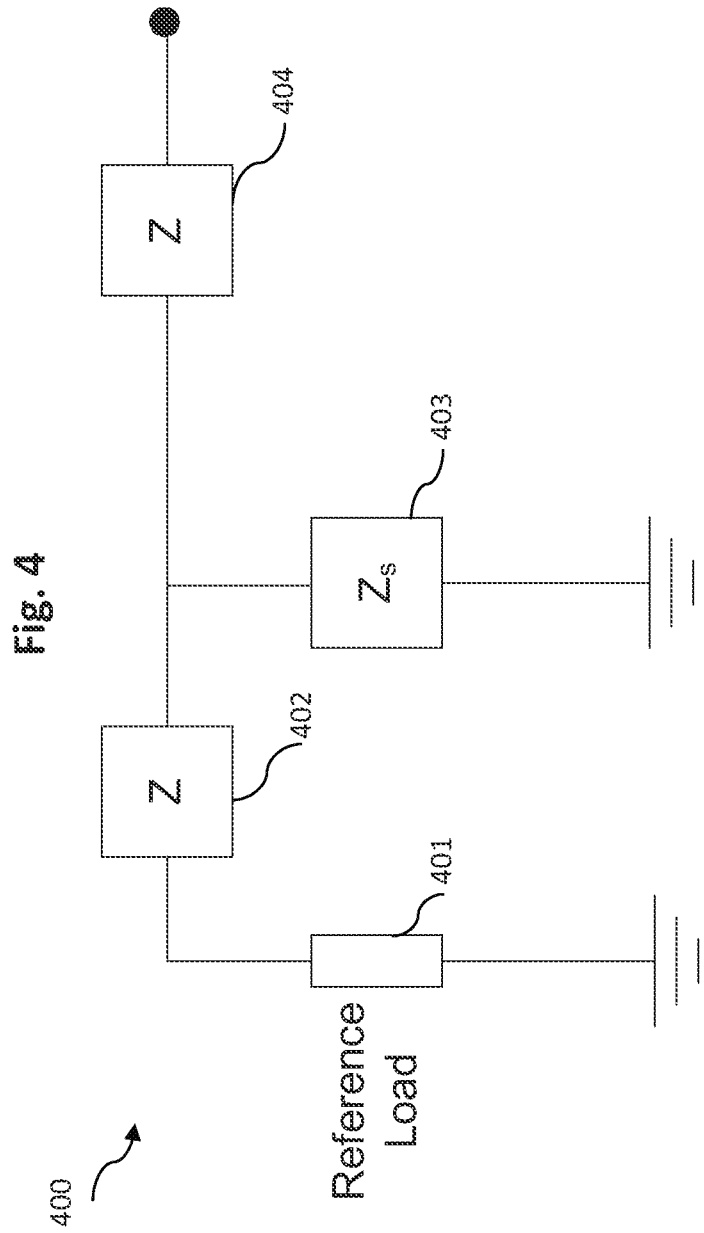
FIG. 4 shows an exemplary matching filter, according to some embodiments of the present invention.

FIG. 2 shows an exemplary Dicke-switched radiometer, according to some embodiments of the present invention. In the present invention, a matching filter 205 is placed before the Dicke switch, as shown. The matching filter 205 uses passive components to match the performance of the antenna element 208 signal, which may be about 100 times lower than the reference signal, enabling a low loss matching. An exemplary matching filtered is shown in FIG. 4 and described below.

In other words, the matched filter 205 provides a suitable frequency and impedance matched electrical network to provide balance of the antenna signal level and the reference signal level at a common reference plane, 1. Additionally, the placement of the filter 205 before the Dicke switch 210 also allows for these losses to be recovered in the post amplification process. Having the filter placed in the front of the reference channel, any losses associated with the filter can be recovered by the subsequent LNA stages Dicke switch 210 rapidly switches the input of the radiometer between the signal channel and the reference channel, i.e., output of the matching filter 205. The output of the Dicke switch 210 is then amplified by an amplification stage 212, including, for example four or more LNA amplifiers.

A synchronous (differential) detector circuit 216 obtains the difference signal from the amplification stage 212. A square waveform that is used to switch the radiometer input from antenna to resistor is also used to drive the synchronous detector. The switching rate is typically between 30 and 1000 Hz. An analog read out circuit 218, as a part of the radiometer or separate from the radiometer, reads the output of the differential circuit and generates a square signal, as shown.

Figure 3:
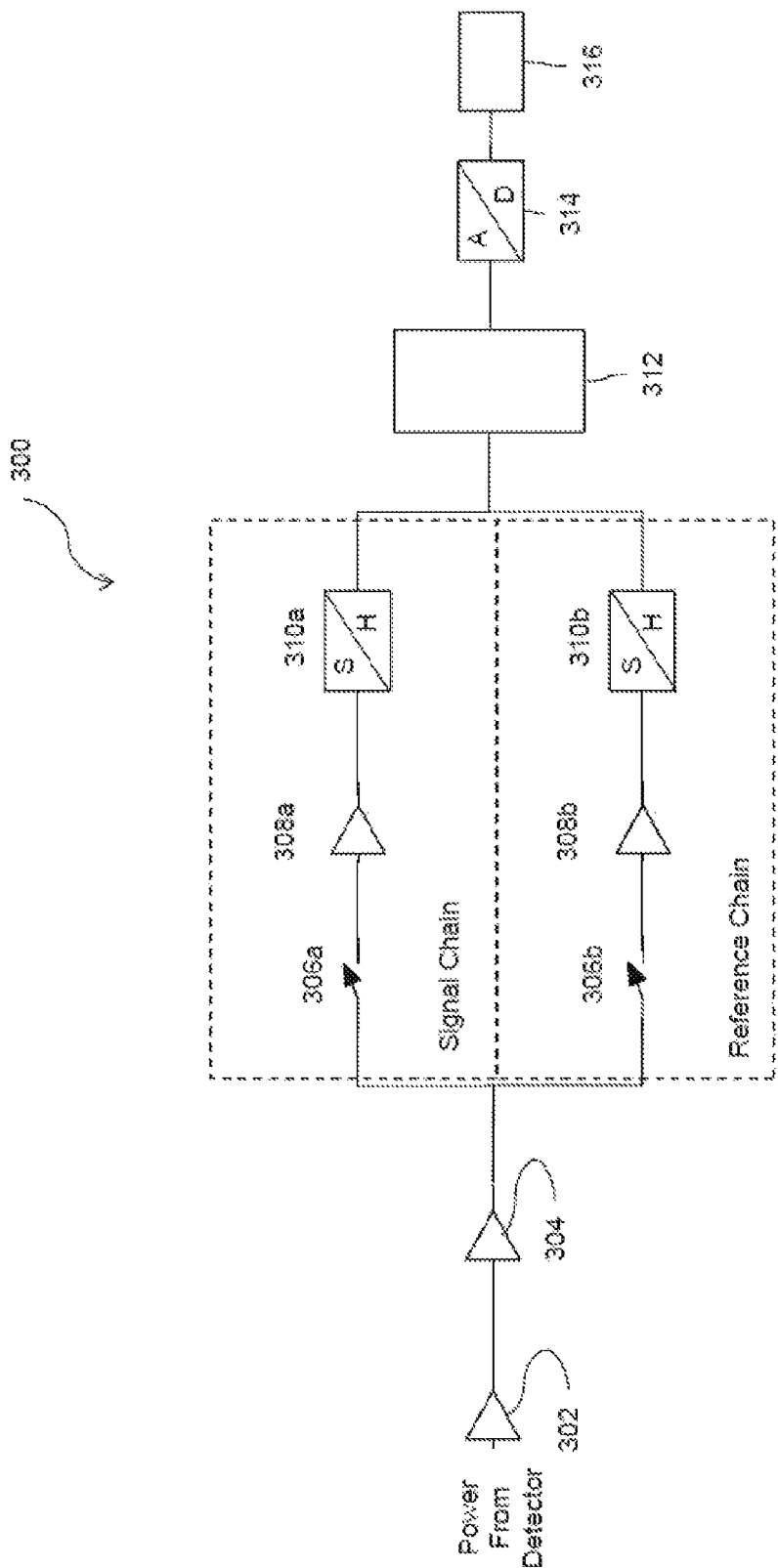
FIG. 3 shows an exemplary read out circuit, according to some embodiments of the present invention.

FIG. 3 shows an exemplary read out circuit, according to some embodiments of the present invention. The read out circuit 300 includes an input buffer 302, which provides an impedance match to the low resistance detector and high impedance analog amplifiers required to provide analog gain. Following the buffer 302, an analog band pass filter 304 centered around the Dicke switch chopping frequency provides additional noise reduction. A set of switches 306a and 306b, operating at the Dicke switch frequency, toggle between the signal and reference chain and thus enabling the integration of both channels as shown in FIG. 4. Once digitized by the integrators 308a, 308b, and sample and hold circuits 310a and 310b, respectively, the two signals and multiplexed by a multiplexor 312 and converted to digital signals by the analog-to-digital convertor (A/D) 314. The two digital signals are then subtracted by a digital subtractor circuit 316 to obtain the counts of the radiometer. The counts have now been fully compensated for all the electronic offset and provide a calibrated temperature. The compensated counts may then be displayed on a screen.

FIG. 4 shows an exemplary matching filter, according to some embodiments of the present invention. As shown, the matching filter 400 provides for a transfer function that may be configured as a high-pass filter, a band-pass filter or a low-pass filter. In the example of FIG. 4, the desired transfer function is realized through a combination of series and shunt resonators 402, 403, 404, which provide frequency dependent impedance matching at the desired frequency range of operation between the reference load 401 and the signal channel at the Dicke switch. Outside of the desired band of operation, the matching filter provides isolation of noise power from the reference load (resistor) 401 to the signal chain at the Dicke switch. Since the matching filter is outside of the signal path connecting the antenna to the detector, the insertion loss of the matching filter does not degrade the received signal.

In the reference load path, the insertion loss of the matching filter is used to shape the noise power of a reference load across frequency to match the antenna insertion loss for the signal chain. For example, in the example of FIG. 4, if resonator $Z_S$ 403 is configured as a short circuited transmission line, the transfer function of the matching filter can provide a high pass response which isolates the lower frequency reference load noise power from the Dicke switched port. In some embodiments, the matching filter operates at microwave and millimeter-wave frequencies to provide the reference channel signal level which is balanced with the antenna signal level, which operates at microwave and millimeter-wave frequencies.

FIG. 5 is an exemplary process flow, according to some embodiments of the present invention. As shown, in block 502, an input signal is received, for example, from an antenna. In block 504, a reference signal is received, for example, from a resistive reference load. The frequency and/or impedance of the reference signal is then matched to the frequency and/or impedance of the input signal, for example by a matching filter, in block 506. In some embodiments, the matching is a frequency dependent impedance matching at the desired frequency range of operation.

In block 508, the input signal and the matched reference signal are inputted to a Dicke switch circuit. This overcomes the attenuation introduced by bandpass filtering that is conventionally used and to reduce reference channel input signals outside of the antenna signal level bandwidth. In block 510, output of the Dicke switch circuit is detected, for example, by a detection circuit. The detected output of the Dicke switch may then be read out by a read out circuit.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A Dicke-switched radiometer comprising:
   a signal channel comprising of an antenna for receiving an input signal and a first stage amplification circuit for amplifying an output of the antenna and generating an amplified input signal;
   a reference channel comprising of a resistive load, a second stage amplification circuit for amplifying an output of the resistive load and generating an amplified reference signal, and a matching filter coupled to an output of the second stage amplification circuit for matching a frequency and an impedance of the amplified input signal to a frequency and an impedance of the amplified reference signal;
   a Dicke switch coupled to first stage amplification circuit and the matching filter for inputting the amplified input signal and an output of the matching filter and switching between the amplified input signal and the output of the matching filter to generate a difference signal;
   a third stage amplification circuit coupled to an output of the Dicke switch for amplifying the difference signal; and
   a detector coupled to an output of the third stage amplification circuit to obtain the amplified difference signal and generate a detected difference signal.

2. The Dicke-switched radiometer of claim 1, further comprising a read out circuit coupled to the detector for reading the detected difference signal and generating a square signal.

3. The Dicke-switched radiometer of claim 1, wherein the matching filter is configured to provide a transfer function that is configured as a high-pass filter, a band-pass filter or a low-pass filter.

4. The Dicke-switched radiometer of claim 1, wherein the matching filter comprises of a combination of connected resonators.

5. The Dicke-switched radiometer of claim 1, wherein the matching filter comprises of:
   a first resonator having first and second terminals and coupled to the resistive load at the first terminal;
   a second resonator having first and second terminals, wherein the first terminal of the second resonator is coupled to the second terminal of the first resonator and the second terminal of the second resonator is coupled to a ground reference; and
   a third second resonator having first and second terminals, wherein the first terminal of the third resonator is coupled to the second terminal of the first resonator and first terminal of the second resonator, and the second terminal of the third resonator is coupled to the Dicke switch.

6. The Dicke-switched radiometer of claim 5, wherein the second resonator is configured as a short circuited transmission line to configure the matching filter to provide a high pass response to isolates a tow frequency reference load noise power from the Dicke switch.

7. The Dicke-switched radiometer of claim 1, wherein the matching filter is capable of operating at microwave and millimeter-wave frequencies to provide a signal which is balanced with the amplified reference signal.

8. A method for matching a Dicke-switched radiometer, the method comprising:
   receiving an input signal from an antenna;
   receiving a reference signal from a load;
   matching a frequency and an impedance of the reference signal to a frequency and an impedance of the input signal;
   inputting the input signal and the matched reference signal to a Dicke switch circuit; and
   detecting an output of the Dicke switch circuit.

9. The method of claim 8, further comprising reading out the detected signal and displaying the read signal on a screen.

10. The method of claim 8, wherein the matching is performed by a high-pass filter, a band-pass filter, or a low-pass filter.

11. The method of claim 8, wherein the matching is performed at microwave and millimeter-wave frequencies.

* * * * *